United States Patent
Hsu et al.

(10) Patent No.: US 12,429,501 B2
(45) Date of Patent: Sep. 30, 2025

(54) METHOD FOR DETECTING CONTACT FORCE OF PROBE CARD

(71) Applicant: Taiwan Semiconductor Manufacturing Company, Ltd., Hsinchu (TW)

(72) Inventors: Ming-Cheng Hsu, Hsin-Chu (TW); Te-Kun Lin, Tainan (TW); Yu-Hsien Tsai, Tainan (TW); Wen-Tsai Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/765,676

(22) Filed: Jul. 8, 2024

(65) Prior Publication Data
US 2024/0361354 A1    Oct. 31, 2024

Related U.S. Application Data

(63) Continuation of application No. 17/460,738, filed on Aug. 30, 2021, now Pat. No. 12,055,563.

(51) Int. Cl.
| | | |
|---|---|---|
| *G01R 1/07* | (2006.01) | |
| *G01L 5/00* | (2006.01) | |
| *G01R 1/073* | (2006.01) | |
| *G01S 17/08* | (2006.01) | |

(52) U.S. Cl.
CPC ............ *G01R 1/07342* (2013.01); *G01L 5/00* (2013.01); *G01S 17/08* (2013.01)

(58) Field of Classification Search
CPC ...... G01R 1/07342; G01R 1/06–07385; G01L 5/00; G01S 17/08
See application file for complete search history.

(56) References Cited

U.S. PATENT DOCUMENTS

| | | | | |
|---|---|---|---|---|
| 5,828,225 | A * | 10/1998 | Obikane | G01R 1/06705 324/750.25 |
| 7,800,387 | B2 * | 9/2010 | Kono | G01R 31/2891 324/750.19 |
| 2006/0097743 | A1 * | 5/2006 | Komatsu | G01R 31/2891 324/750.17 |
| 2013/0106455 | A1 * | 5/2013 | Edwards | G01R 31/2891 324/754.1 |
| 2018/0259555 | A1 * | 9/2018 | Yeh | G01R 1/06705 |

FOREIGN PATENT DOCUMENTS

| | | | | |
|---|---|---|---|---|
| CN | 110426539 A | * | 11/2019 | G01N 3/02 |
| CN | 210465666 U | * | 5/2020 | G01R 35/00 |

OTHER PUBLICATIONS

English Machine Translation of Hu et al. CN-210465666-U (Year: 2020).

* cited by examiner

*Primary Examiner* — Lee E Rodak
*Assistant Examiner* — Taqi R Nasir
(74) *Attorney, Agent, or Firm* — McClure, Qualey & Rodack, LLP

(57) ABSTRACT

A method for detecting a contact force of a probe card is provided. The method includes contacting a pressure film sensor with a plurality of needles over a lower surface of the probe card. The method includes detecting the contact force of the probe card via the pressure film sensor. The method also includes adjusting a position of a push base over an upper surface of the probe card based on the detected contact force of the pressure film sensor.

20 Claims, 6 Drawing Sheets

METHOD FOR DETECTING CONTACT FORCE OF PROBE CARD

CROSS REFERENCE TO RELATED APPLICATIONS

This application is a Continuation of pending U.S. patent application Ser. No. 17/460,738, filed Aug. 30, 2021 and entitled "PROBE CARD, APPARATUS AND METHOD FOR DETECTING CONTACT FORCE OF PROBE CARD", now U.S. Pat. No. 12,055,563, the entirety of which is incorporated by reference herein.

BACKGROUND

A probe card is an interface between an electronic test system and a semiconductor wafer. Typically, the probe card is mechanically docked to a prober and electrically connected to a tester, and its purpose is to provide an electrical path between the test system and the circuits on the wafer, thereby permitting the testing and validation of the circuits at the wafer level, usually before they are diced and packaged.

Although existing probe cards and methods of detecting conditions of probe cards have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
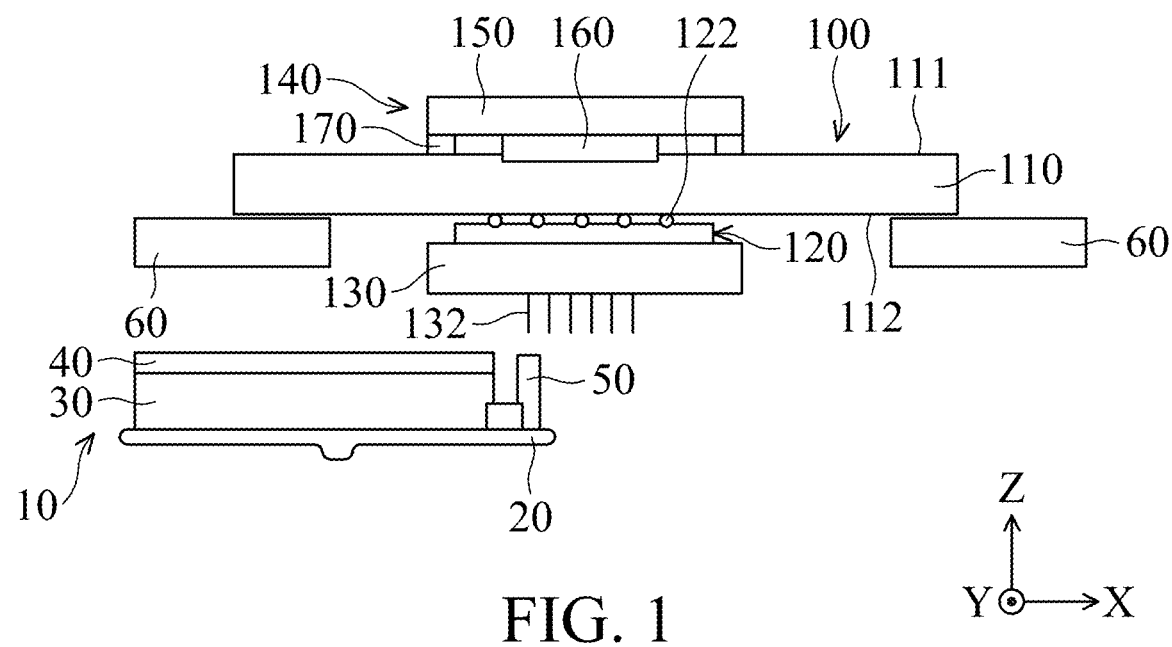
FIGS. 1-3 are perspective representations of various stages of detecting a condition of a probe card, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments of a probe card, an apparatus and method for detecting a condition of a probe card are provided. The apparatus includes a pressure film sensor disposed on a movable stage for performing force unbalance test in a shorter time. The apparatus also includes a distance detector disposed on a movable stage for ensuring the pressure film sensor in contact with the needles successfully. The apparatus further includes an adjustment driver for adjust the probe card based on a detection result of the pressure film sensor.

Figure 2:
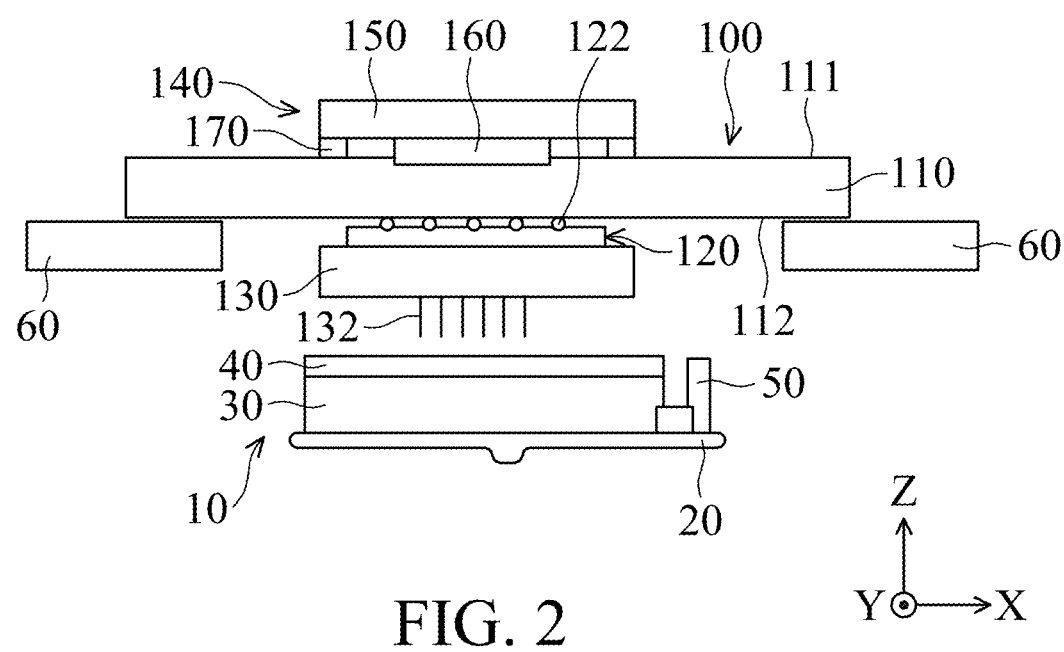
Figure 3:
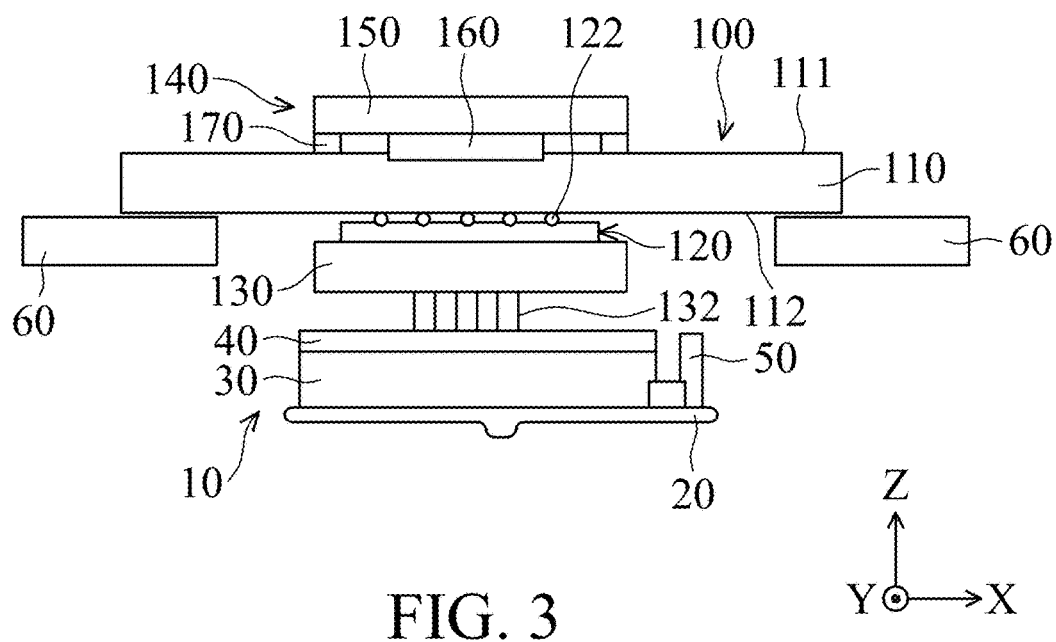

FIGS. 1-3 are perspective representations of various stages of detecting a condition of a probe card, in accordance with some embodiments of the disclosure. As shown in FIG. 1, a probe card 100 is provided. The probe card 100 includes a substrate 110, and the substrate 110 has an upper surface 111 and a lower surface 112. The substrate 110 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 110 may be a semiconductor-on-insulator (SOI) substrate. Generally, an SOI substrate includes a layer of a semiconductor material such as epitaxial silicon, germanium, silicon germanium, SOI, silicon-germanium-on-insulator (SGOI), or a combination thereof. The substrate 110 includes, in one alternative embodiment, an insulating material such as a fiberglass reinforced resin material. One example material is fiberglass resin such as FR-4 fiberglass. Alternatives for the material include bismaleimide-triazine (BT) resin, or alternatively, other printed circuit board (PCB) materials or films. Build up films such as Ajinomoto Build-up Film (ABF) or other laminates may be used for substrate 110.

The substrate 110 may include active and passive devices (not shown). A wide variety of devices such as transistors, capacitors, resistors, combinations of these, and the like may be used to generate the structural and functional design for the device stack. The devices may be formed using any suitable methods, and the detail for forming these devices will not be discussed herein since those skilled in the art should understand how to form these devices in the substrate 110.

The substrate 110 may also include metallization layers and vias (not shown), with the bond pads (not shown) being physically and/or electrically coupled to the metallization layers and vias. The metallization layers may be formed over the active and passive devices and are designed to connect the various devices to form functional circuitry. The metallization layers may be formed of alternating layers of dielectric material (such as low-k dielectric material) and conductive material (such as copper) with vias interconnecting the layers of conductive material and may be formed through any suitable process (such as deposition, damascene, dual damascene, or the like). In some embodiments, the substrate 110 is substantially free of active and passive devices.

In some embodiments, the probe card 100 further includes a transfer board 120 that is disposed on the lower surface 112 of the substrate. The transfer board 120 is electrically and physically connected to the substrate 110 via a plurality of conductive connectors 122. As such, a conductive circuit is formed between the substrate 110 and the transfer board 120, and electrical signals may be transmitted between the substrate 110 and the transfer board 120.

For example, the conductive connectors 122 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 122 may include a conductive material such as solder, copper, aluminum, gold, nickel, silver, palladium, tin, the like, or a combination thereof. In some embodiments, the conductive connectors 122 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 122 include metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In some embodiments, the probe card 100 includes a probe head 130. The probe head 130 includes a plurality of needles 132. The needles 132 are provided for detecting probe card unbalance issues. For example, an apparatus may be provided to detect the needles 132 and determine if a probe card unbalance issue occurs, which will be discussed in detail as follows. In some embodiments, a cross-sectional area of a tip of each of the needles 132 is not greater than about 60 µm×about 60 µm. In some embodiments, a pitch between two adjacent needles 132 is not greater than about 100 µm, and therefore the probe head 130 may be adopted to detect advance devices. In some embodiments, the needles 132 are arranged in a rectangular region. However, these embodiments are examples, and the present disclosure is not limited thereto.

In addition, the probe card 100 includes a support assembly 140. In some embodiments, the probe head 130 is located directly below the support assembly 140. In some embodiments, the support assembly 140 includes a support 150, a push base 160, and a connector 170. The push base 160 is disposed on the upper surface 111 of the substrate 110, and contacts the upper surface 111. The support 150 is disposed on the push base 160, and the support 150 and the substrate 110 are located on opposite sides of the push base 160. In some embodiments, the support 150 is connected to the substrate 110 via the push base 160. The connector 170 is disposed on the upper surface 111 of the substrate 110, and contacts the upper surface 111. The support 150 is disposed on the connector 170, and the support 150 and the substrate 110 are located on opposite sides of the connector 170. In some embodiments, the support 150 is connected to the substrate 110 via the connector 170. In some embodiments, the support 150 and the connector 170 are integrally formed. The arrangement of the support assembly 140 is helpful for withstanding stress of the probe card 100 and enhancing the structural strength of the probe card 100.

As shown in FIG. 1, a processing apparatus 10 is provided. The processing apparatus 10 includes a stage 20 and a plate 30. In some embodiments, the stage 20 is movable in multiple dimensions. For example, the stage 20 is movable in the X-Y plane and in the Z axis (that is substantially perpendicular to the X-Y plane). In some embodiments, the stage 20 is movable arbitrarily in three dimensions (3D). In some embodiments, the stage is rotatable about a rotation axis that may be parallel to or perpendicular to the Z axis. In some embodiments, the rotation axis is neither parallel to nor perpendicular to the Z axis. The plate 30 is disposed on the stage 20 and is also movable with the stage 20.

In addition, the processing apparatus 10 includes a pressure film sensor 40, and the pressure film sensor 40 is formed on the plate 30. In some embodiments, the pressure film sensor 40 is configured to detect the contact force between the pressure film sensor 40 and the needles 132 when the pressure film sensor 40 contacts the needles 132. In some embodiments, a cross-sectional area of the pressure film sensor 40 is greater than a cross-sectional area of the probe head 130, and the cross-sectional area of the pressure film sensor 40 and the cross-sectional area of the probe head 130 are measured in a plane that is substantially parallel to the X-Y plane. After measuring some or all of the needles 132 by the pressure film sensor 40, it is determined whether a probe card unbalance issue occurs. A probe card unbalance issue may be determined based on the contact force between the pressure film sensor 40 and different needles 132. To be more specific, if the contact force between the pressure film sensor 40 and one needle 132 is different from the contact force between the pressure film sensor 40 and another needle 132, it is determined that the probe card unbalance issue occurs. If the probe card unbalance issue occurs, an adjustment process would be subsequently performed to the probe card 100 for solving the above issue. Otherwise, the adjustment process may be omitted, and the probe card 100 may be removed and/or transferred to other positions for subsequent processes.

The processing apparatus 10 further includes a distance detector 50 that is connected to the plate 30. In some embodiments, the plate 30, the pressure film sensor 40, and the distance detector 50 are all disposed on and movable with the stage 20. The distance detector 50 is configured to detect a distance between the needles 132 and the pressure film sensor 40 (to be more specific, a distance between the bottommost point of the needles 132 and the upper surface of the pressure film sensor 40). As such, the pressure film sensor 40 may contact the needles 132 successfully based on the detection of the distance detector 50.

As shown in FIG. 1, the processing apparatus 10 includes a holder 60 for carrying a probe card 100 to be tested. In some embodiments, the holder 60 may be a movable holder that carries the probe card 100 to a suitable position corresponding to the processing apparatus 10. In some embodiments, the holder 60 may be a wall of a process tool, and the processing apparatus 10 is disposed and operated in the process tool. An opening is formed on the wall and surrounded by the holder. The probe card 100 is transferred onto the holder 60, and the probe head 130 (including the needles 132) is exposed by the opening. As such, a detection process may be performed to the needles 132 by the processing apparatus 10. The probe card 100 is tested out of the production line, and therefore the testing (including the measurement and/or the adjustment) would not affect the normal processes performed on the production line. In the present embodiment, the probe card 100 is provided on the holder 60 before the pressure film sensor 40 of the processing apparatus 10 is aligned with the probe card 100 (for example, located directly below the needles 132 on the probe head 130, as shown in FIG. 2).

As shown in FIG. 2, the pressure film sensor 40 of the processing apparatus 10 is aligned with the needles 132. In some embodiments, the stage 20 moves horizontally (for example, in the X axis) to be positioned directly under the needles 132. In some embodiments, the distance detector 50 approaches the needles 132 prior to the pressure film sensor 40. Accordingly, the distance detector 50 may obtain the distance between the needles 132 and the pressure film sensor 40 before the pressure film sensor 40 is positioned directly below the needles 132. In some embodiment, the distance detector 50 may obtain the distance between the needles 132 and the pressure film sensor 40 after the pressure film sensor 40 is positioned directly below the needles 132, as long as the distance between the needles 132 and the pressure film sensor 40 is obtained before the pressure film sensor 40 is in contact with the needles 132. As a result, the pressure film sensor 40 may contact the needles 132 successfully based on the detection of the distance detector 50.

In some embodiments, the distance detector 50 detects the distance between the needles 132 and the pressure film sensor 40 in an optical manner. To be more specific, for example, the distance detector 50 includes an emitter and a receiver (not shown). The emitter is configured to emit a signal toward the needles 132, and the receiver is configured to receive the emitted signal that is reflected by the needles 132. In some embodiments, the signal emitted by the emitter includes visible light, invisible light, or any other suitable optical signals. In some embodiments, the signal is emitted by the emitter of the distance detector 50 in a direction that is substantially parallel to the Z axis. In some embodiments, the signal is emitted by the emitter of the distance detector 50 in a direction that is neither parallel to nor perpendicular to the Z axis. In some embodiments, the signal is emitted by the emitter of the distance detector 50 during the movement (for example, substantially parallel to the X axis) of the stage 20. In some embodiments, the signal is emitted by the emitter of the distance detector 50 after the stage 20 is located at the desired position. In some embodiments, after the signal is received, the distance between the needles 132 and the pressure film sensor 40 may be obtained by the distance detector 50. In some embodiments, the distance between the needles 132 and the pressure film sensor 40 is obtained by an external processor that is electrically coupled to the distance detector 50. However, the present disclosure is not limited thereto, and any other suitable method may also be adopted.

As shown in FIG. 3, the stage 20 moves upward and the pressure film sensor 40 contact the needles 132. In some embodiments, the pressure film sensor 40 contacts all the needles 132 simultaneously, and therefore the measurement performed by the pressure film sensor 40 may be less time-consuming and less complicated. In some embodiments, the width of the pressure film sensor 40 is greater than the width of the region where the needles 132 are arranged, which enables the pressure film sensor 40 to contact all the needles 132 simultaneously. In some embodiments, the pressure film sensor 40 contacts more than one of the needles 132 at the same time for saving the time required for the testing.

In some embodiments, the detected contact forces are read by the controller 65, which also determines whether the probe card unbalance issue occurs. If the probe card unbalance issue occurs, an adjustment process is performed to the probe card 100. For example, the support assembly 140 is adjusted or re-positioned for balancing the contact forces between the pressure film sensor 40 and different needles 132. In some embodiments, the support assembly 140 of the probe card 100 is adjusted on the holder 60 of the processing apparatus 10. In some embodiments, the probe card 100 is removed from the holder 60 of the processing apparatus 10 and transferred to an adjustment tool (not shown) to perform the adjustment process.

Figure 4:
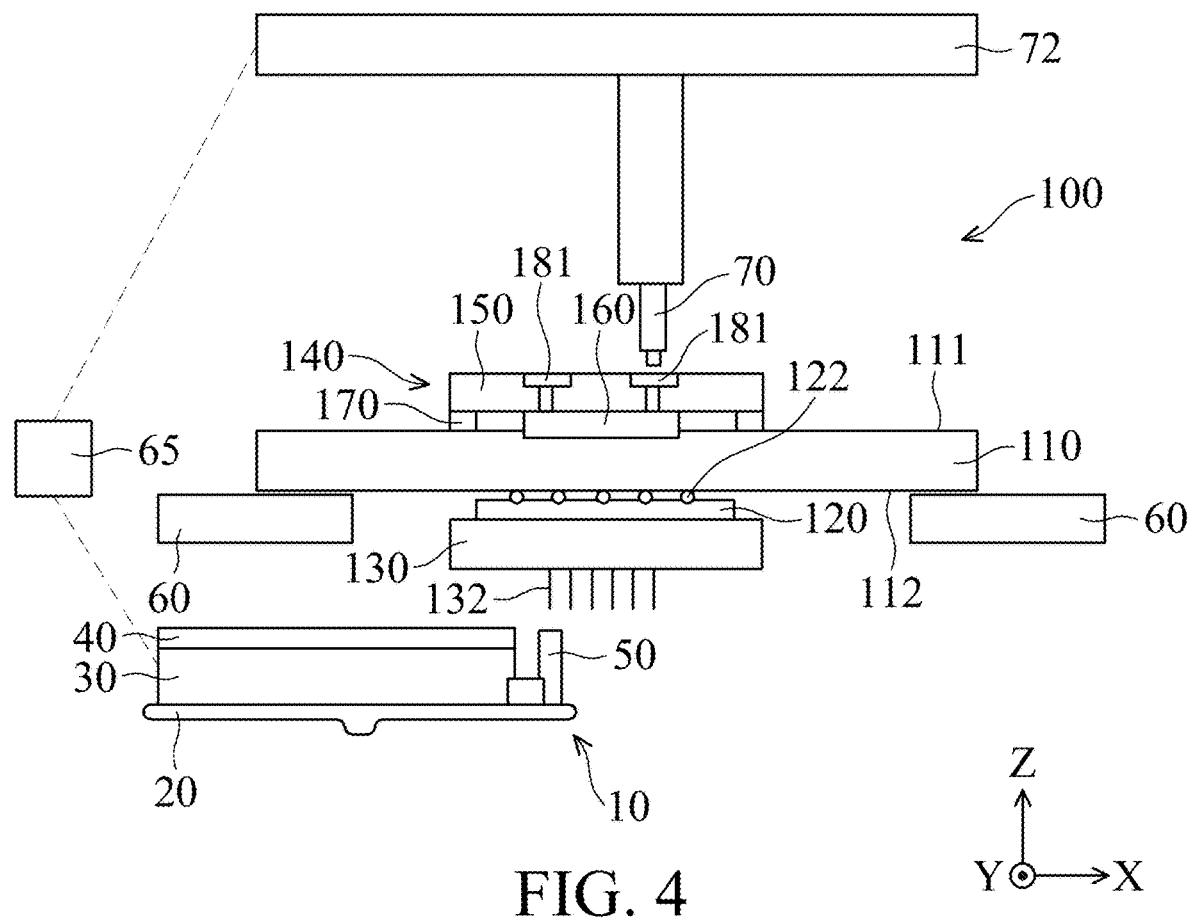
FIGS. 4-7 are perspective representations of various stages of detecting a contact force of a probe card, in accordance with some embodiments of the disclosure.

FIGS. 4-7 are perspective representations of various stages of detecting a contact force of a probe card, in accordance with some embodiments of the disclosure. It should be appreciated that most of the arrangements in FIG. 4 are the same as those in FIG. 1, so only the different parts are described here. As shown in FIG. 4, the support assembly 140 further includes a plurality of first positioning elements 181. The first positioning elements 181 are disposed in the support 150 and configured to abut the push base 160. The first positioning elements 181 are adjustable by a driver (such as an adjustment driver 70, which will be discussed as follows). To be more specific, the first positioning elements 181 may be adjusted upward or downward to change the position of the first positioning elements 181 relative to the push base 160 in a direction that is substantially parallel to the Z axis. As a result, the contact force between the first positioning elements 181 and the push base 160 may be adjusted, and therefore the position of the push base 160 relative to the substrate 110 and the force applied to the substrate 110 are also changed. The detailed structure of the support assembly 140 will be further discussed in accompany with FIGS. 8 and 9 as follows.

In addition, the processing apparatus 10 includes an adjustment driver 70 and a stage 72 that is movable. The adjustment driver 70 is connected to the stage 72 and therefore is movable with the stage 72. In some embodiments, the stage 72 is movable in multiple dimensions. For example, the stage 72 is movable in the X-Y plane and in the Z axis (that is substantially perpendicular to the X-Y plane). In some embodiments, the stage 72 is movable arbitrarily in three dimensions (3D). In some embodiments, the stage is rotatable about a rotation axis that may be parallel to or perpendicular to the Z axis. In some embodiments, the rotation axis is neither parallel to nor perpendicular to the Z axis.

Figure 5:
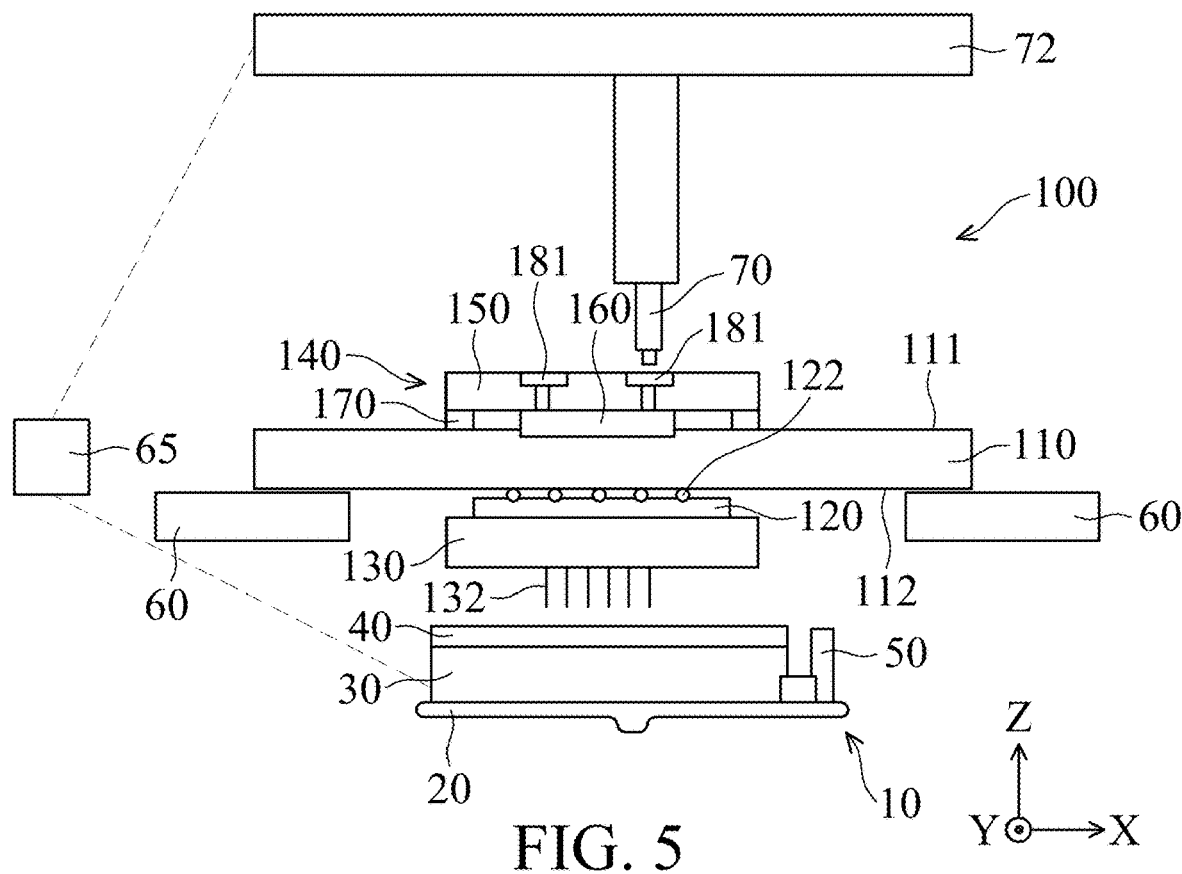

Similarly, as shown in FIG. 5, the pressure film sensor 40 of the processing apparatus 10 is aligned with the needles 132. In some embodiments, the stage 20 moves horizontally (for example, in the X axis) to be positioned directly under the needles 132. In some embodiments, the distance detector 50 approaches the needles 132 prior to the pressure film sensor 40. Accordingly, the distance detector 50 may obtain the distance between the needles 132 and the pressure film sensor 40 before the pressure film sensor 40 is positioned below the needles 132. As a result, the pressure film sensor 40 may contact the needles 132 successfully based on the detection of the distance detector 50. In some embodiments, the distance detector 50 detects the distance between the needles 132 and the pressure film sensor 40 in an optical manner. However, the present disclosure is not limited thereto, and any other suitable method may also be adopted.

Figure 6:
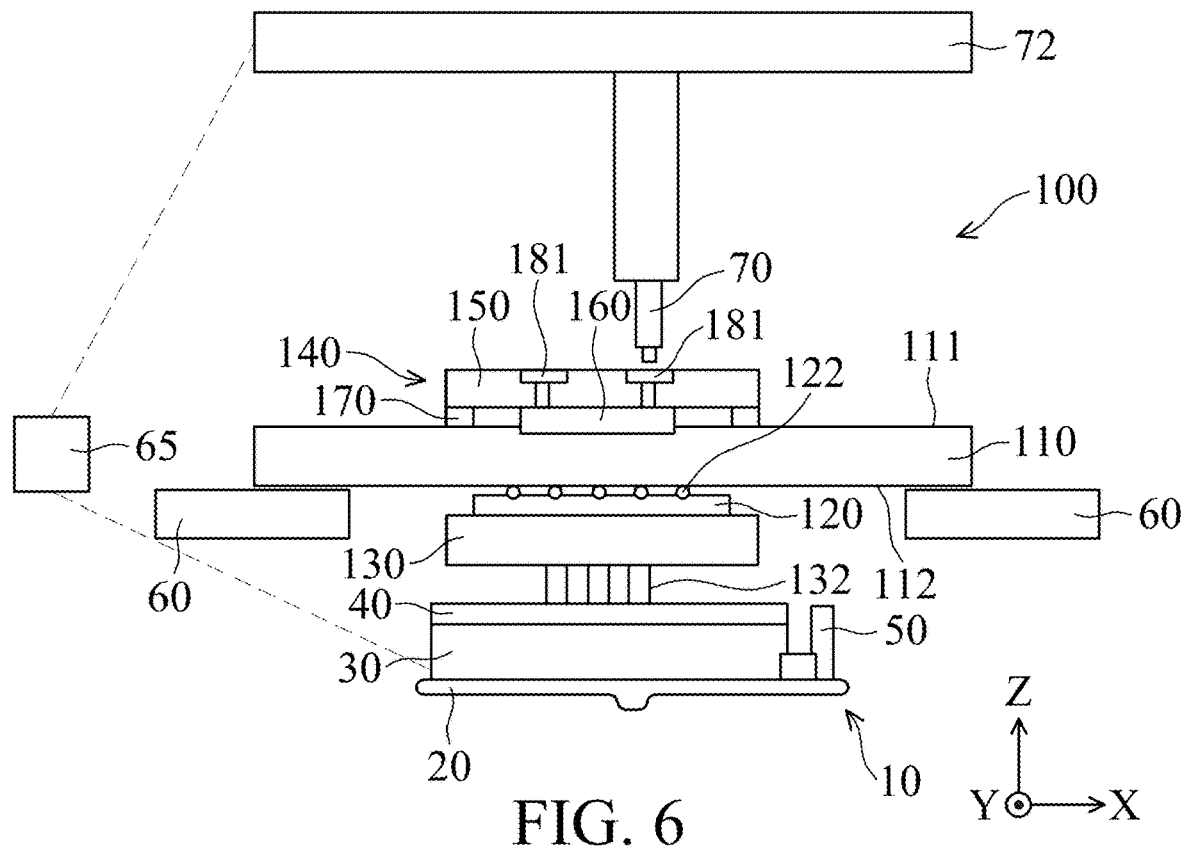

Similar to FIG. 3, as shown in FIG. 6, the stage 20 moves upward and the pressure film sensor 40 contact the needles 132. In some embodiments, the pressure film sensor 40 contacts all the needles 132 simultaneously, and therefore the measurement performed by the pressure film sensor 40 may be less time-consuming and less complicated. In some embodiments, the pressure film sensor 40 contacts more than one the needles 132 at the same time for saving the time required for the testing. If a probe card unbalance issue occurs (the determination of the probe card unbalance issue has been set forth above), an adjustment process is performed to the probe card 100 for subsequent processes.

Figure 7:
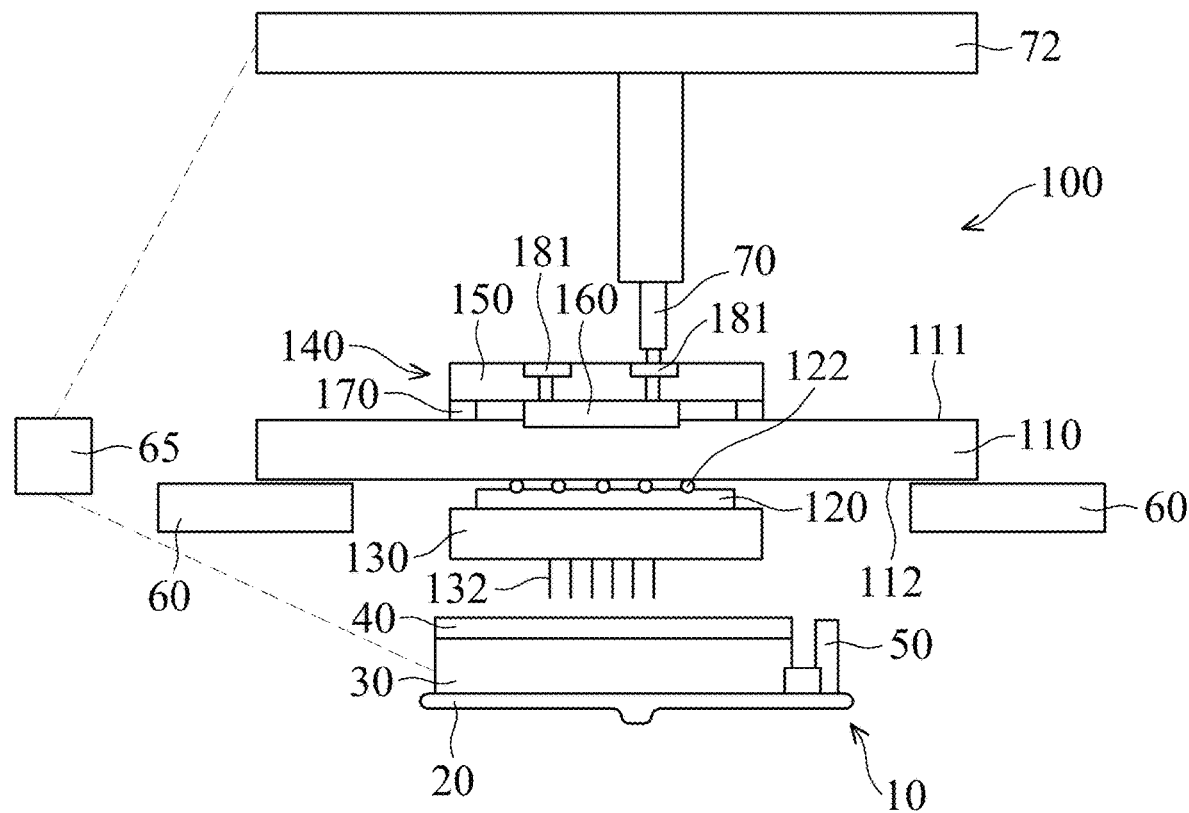

As shown in FIG. 7, after the pressure film sensor 40 contacts the needles 132, the stage 20 moves downward to release the pressure film sensor 40 from the needles 132. The detection result (for example, the detected contact force between the pressure film sensor 40 and the needles 132 of the probe card 130) of the pressure film sensor 40 may be transmitted to a controller 65 that is electrically coupled to the pressure film sensor 40. In some embodiments, the controller 65 is electrically connected to the pressure film sensor 40 wirelessly. In some embodiments, the controller 65 is wired to the pressure film sensor 40. In some embodiments, electrical signals are subsequently transmitted to the adjustment driver 70 from the controller 65.

To be more specific, the electrical signals are transmitted to the adjustment driver 70 according to the detection result of the pressure film sensor 40. As a result, the adjustment driver 70 adjusts the first positioning elements 181 (for example, in a contact manner) in order to adjust the arrangement of the support assembly 140 for solving the probe card unbalance issue (if present). As set forth above, the adjustment driver 70 is connected to and driven by the stage 72, and the adjustment driver 70 is movable horizontally (for example, in the X-Y plane) and/or vertically (for example, in the Z axis). Accordingly, the adjustment driver 70 may be aligned with the target first positioning element 181 and perform the adjustment process to the target first positioning element 181.

Figure 8:
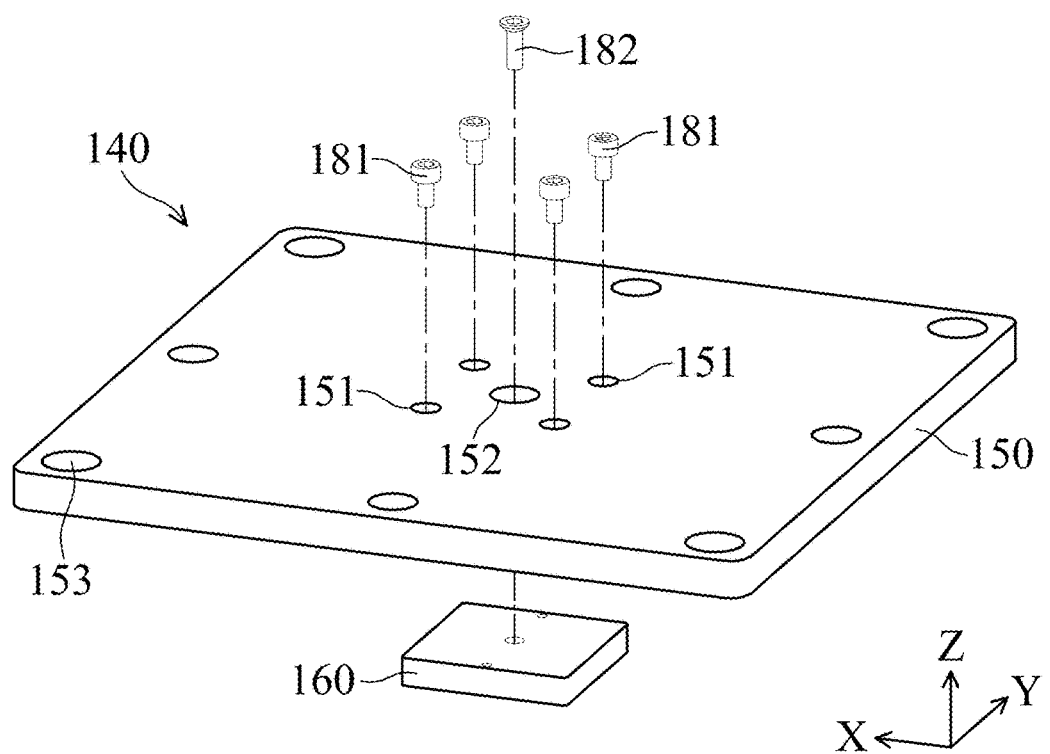
FIG. 8 is an exploded view illustrating a support assembly, in accordance with some embodiments of the disclosure.
Figure 9:
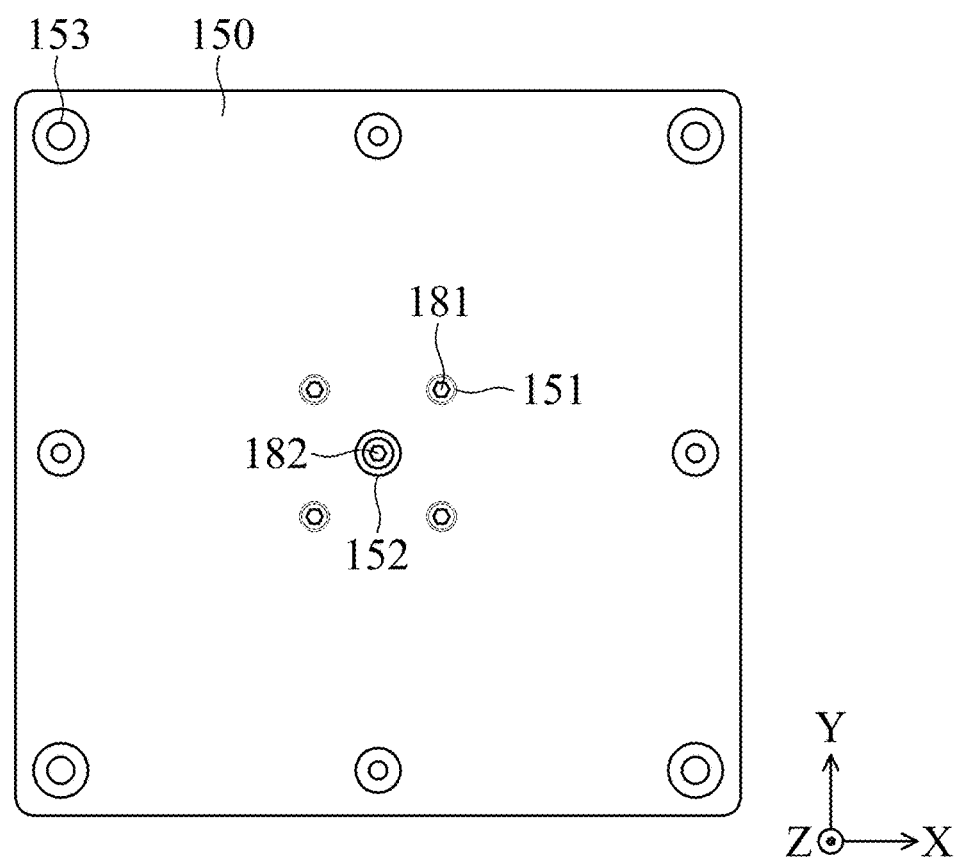
FIG. 9 is a top view illustrating the support assembly shown in FIG. 8, in accordance with some embodiments of the disclosure.

FIG. 8 is an exploded view illustrating the support assembly 140, in accordance with some embodiments of the disclosure. FIG. 9 is a top view illustrating the support assembly shown in FIG. 8, in accordance with some embodiments of the disclosure. As shown in FIG. 8, the support assembly 140 includes a support 150 and a push base 160. A plurality of first positioning elements 181 and a second positioning element 182 are provided to connect the support 150 and the push base 160. In some embodiments, four first positioning elements 181 are provided and surround the second positioning element 182. In some embodiments, the first positioning elements 181 are arranged as a matrix. As such, the position of the push base 160 may be adjusted precisely. It should be understood that the above arrangement of the first positioning elements 181 and the second positioning element 182 are merely an example, and those skilled in the art should be able to adopt any arrangement of the first positioning elements 181 and the second positioning element 182. In some embodiments, the support 150 has a plurality of first holes 151 for containing the first positioning elements 181 and a second hole 152 for containing the second positioning element 182. It should be appreciated that a cross-sectional area of each of the first holes 151 corresponds to a cross-sectional area of each of the first positioning elements 181, and a cross-sectional area of the second hole 152 corresponds to a cross-sectional area of the second positioning element 182. However, the present disclosure is not limited thereto. In some embodiments, a rounded corner or a chamfer (not shown) may be provided on the first holes 151 and/or the second hole 152 for facilitating the arrangement of the first positioning elements 181 and/or the second positioning element 182.

In some embodiments, the cross-sectional area of the first positioning element 181 is substantially the same as the cross-sectional area of the second positioning element 182. In some embodiments, the cross-sectional area of the first positioning element 181 is different from the cross-sectional area of the second positioning element 182. For example, in some embodiments, the cross-sectional area of the first positioning element 181 is greater than the cross-sectional area of the second positioning element 182. In some embodiments, the cross-sectional area of the first positioning element 181 is smaller than the cross-sectional area of the second positioning element 182. It is noted that all the above cross-sectional area are measured on a plane that is substantially parallel to the X-Y plane, for example. However, the present disclosure is not limited thereto.

In some embodiment, the second positioning element 182 is configured to link the support 150 and the push base 160. In some embodiment, the first positioning elements 181 are configured to abut the push base 160 and adjust the force between the support 150 and the push base 160. In some embodiment, if the first positioning elements 181 need to be significantly adjusted, the second positioning element 182 may also be adjusted. To be more specific, since the second positioning element 182 links and penetrates the support 150 and the push base 160, the second positioning element 182 affects the connection more significantly. Therefore, adjusting the second positioning element 182 would help to position the push base 160 more rapidly (which is compared to adjusting the first positioning elements 181). In addition, the support 150 also has a plurality of third holes 153 around the edges of the support 150. In some embodiments, eight third holes 153 are provided and surround the first holes 151 and the second hole 152. As such, the support 150 may be firmly affixed to the connector 170. It should be understood that the above arrangement of the third holes 153 are merely an example, and those skilled in the art should be able to adopt any arrangement of the third holes 153. In some embodiments, the third holes 153 are provided for fasteners (not shown) that affix the support 150 to the connector 170. In some embodiments, the fasteners also affix the support 150 and the connector 170 to the substrate 110. In some embodiments, the support 150 and the connector 170 are integrally formed, and therefore the third holes 153 are omitted.

Figure 10:
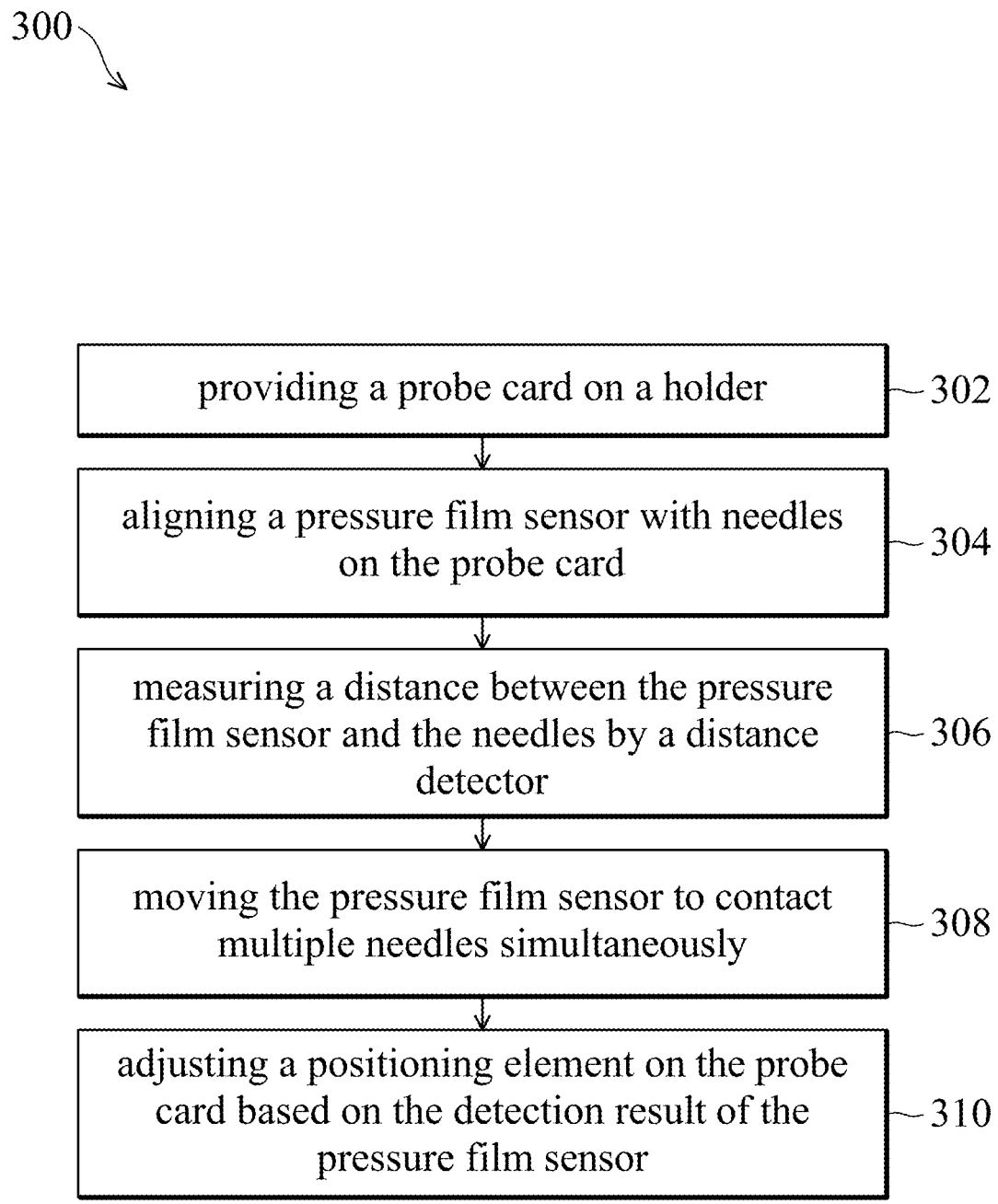
FIG. 10 is a flow chart illustrating a method for detecting a condition of a probe card, in accordance with some embodiments of the disclosure.

FIG. 10 is a flow chart illustrating a method for detecting a condition of a probe card, in accordance with some embodiments of the disclosure. As shown in FIG. 10, a method 300 is provided. In some embodiment, an operation 302 is performed, in which a probe card is provided on a holder. Then, an operation 304 is performed after the operation 302 is complete, in which a pressure film sensor is aligned with needles on the probe card. In some embodiments, during the alignment between the pressure film sensor and the needles, an operation 306 is performed, in which a distance between the pressure film sensor and the needles is measured by a distance detector.

After the operation 306 is complete, an operation 308 is performed, in which the pressure film sensor is moved to contact multiple needles simultaneously. In some embodiments, some (not all) of the needles are in contact with the pressure film sensor at the same time. In some embodiments, all of the needles are in contact with the pressure film sensor at the same time. Then, an operation 310 is performed, in which a positioning element on the probe card is adjusted according to the detection result of the pressure film sensor.

Embodiments of a probe card, an apparatus and method for detecting a condition of a probe card. The apparatus includes a pressure film sensor and a distance detector disposed on a movable stage. The pressure film sensor is configured to detect a plurality of needles on a probe head of a probe card simultaneously. Therefore, the force unbalance test may be performed in a shorter time. The distance detector is configured to detect a distance between the pressure film sensor and the needles for ensuring the pressure film sensor in contact with the needles successfully. The apparatus includes an adjustment driver electrically connected to the pressure film sensor and configured to adjust the probe card based on a detection result of the pressure film sensor. As such, the probe card is adjusted in time after the detection is complete.

In some embodiments, a method for detecting a contact force of a probe card is provided. The method includes contacting a pressure film sensor with a plurality of needles over a lower surface of the probe card. The method includes detecting the contact force of the probe card via the pressure film sensor. The method also includes adjusting a position of a push base over an upper surface of the probe card based on the detected contact force of the pressure film sensor.

In some embodiments, a method for detecting a contact force of a probe card is provided. The method includes moving a pressure film sensor over a stage to contact a plurality of needles on a substrate of the probe card. The method includes detecting the contact force of the probe card using the pressure film sensor. The method also includes adjusting a support assembly of the probe card based on a detection result of the pressure film sensor if an unbalance contact force of the probe card is detected. Adjusting the support assembly of the probe card comprises adjusting a plurality of first positioning elements disposed around a center of the support assembly.

In some embodiments, a method for detecting a contact force of a probe card is provided. The method includes placing the probe card on a holder. A probe head of the probe card is exposed from the holder. The method includes moving a pressure film sensor towards a plurality of needles of the probe head. The needles extend lower than the holder while the probe card is placed on the holder. The method includes detecting the contact force of the probe card by contacting the pressure film sensor with more than one of the needles simultaneously. The method also includes adjusting a plurality of first positioning elements to correct unbalance contact force of the probe card while the probe card is placed on the holder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for detecting a contact force of a probe card, comprising:
    contacting a pressure film sensor with a plurality of needles over a lower surface of a substrate of the probe card;
    detecting the contact force of the probe card via the pressure film sensor; and
    adjusting a position of a push base over an upper surface of the substrate based on the detected contact force of the pressure film sensor, wherein adjusting the position of the push base over the upper surface of the substrate comprises adjusting a plurality of first positioning elements in a support, and the support is affixed to the upper surface of the substrate via a connector around the first positioning elements.

2. The method of claim 1, wherein the first positioning elements abut the push base.

3. The method of claim 2, wherein adjusting the position of the push base over the upper surface of the substrate further comprises:
    adjusting a second positioning element linking the support and the push base, wherein the second positioning element is surrounded by the first positioning elements.

4. The method of claim 3, wherein a cross-sectional area of the first positioning elements is different from a cross-sectional area of the second positioning element.

5. The method of claim 3, wherein the second positioning element penetrates the support and the push base.

6. The method of claim 2, wherein the first positioning elements are arranged as a matrix.

7. The method of claim 2, wherein adjusting the first positioning elements in the support abutting the push base further comprises:
    adjusting the first positioning elements upward or downward to change positions of the first positioning elements relative to the push base using an adjustment driver.

8. A method for detecting a contact force of a probe card, comprising:
    moving a pressure film sensor over a stage to contact a plurality of needles on a substrate of the probe card;
    detecting the contact force of the probe card using the pressure film sensor; and
    adjusting a support assembly of the probe card based on a detection result of the pressure film sensor if an unbalance contact force of the probe card is detected, wherein adjusting the support assembly of the probe card comprises adjusting a plurality of first positioning elements disposed around a center of the support assembly, wherein the support assembly comprises a support affixed to the substrate via a connector on a plurality of edges of the support.

9. The method of claim 8, wherein adjusting the support assembly of the probe card further comprises adjusting a second positioning element disposed at the center of the support assembly.

10. The method of claim 9, wherein the second positioning element extends closer to the substrate than the first positioning elements.

11. The method of claim 8, further comprising:
    measuring a distance between the pressure film sensor and the needles of the probe card prior to contacting the pressure film sensor and the needles.

12. The method of claim 11, wherein the distance between the pressure film sensor and the needles of the probe card is measured by a distance detector over the stage.

13. The method of claim 8, wherein the stage is movable arbitrarily in three dimensions.

14. The method of claim 8, wherein the stage is rotatable about a rotation axis that is parallel to or perpendicular to a normal direction of the substrate.

15. A method for detecting a contact force of a probe card, comprising:
- placing the probe card on a holder, wherein a probe head of the probe card is exposed from the holder;
- moving a pressure film sensor towards a plurality of needles of the probe head, wherein the needles extend lower than the holder while the probe card is placed on the holder;
- detecting the contact force of the probe card by contacting the pressure film sensor with more than one of the needles simultaneously; and
- adjusting a plurality of first positioning elements in a support to abut a push base to correct unbalance contact force of the probe card while the probe card is placed on the holder, wherein the support is affixed to a substrate of the probe card via a connector around the first positioning elements, and the connector is laterally separated from the push base.

16. The method of claim 15, wherein the probe head and the first positioning elements are located on opposite surfaces of the probe card.

17. The method of claim 15, wherein adjusting the first positioning elements further comprises using an adjustment driver that is movable arbitrarily in three dimensions.

18. The method of claim 17, further comprising:
- releasing the pressure film sensor from the needles while the probe card is placed on the holder.

19. The method of claim 18, further comprising:
- after the pressure film sensor is released from the needles, transmitting a detection result to the movable adjustment driver via a controller.

20. The method of claim 15, wherein a width of the pressure film sensor is greater than a width of the probe head.

* * * * *